United States Patent [19]

Maeda et al.

[11] Patent Number: 5,346,765

[45] Date of Patent: * Sep. 13, 1994

[54] COVER TAPE FOR PACKAGING CHIP TYPE ELECTRONIC PARTS

[75] Inventors: Shigeru Maeda, Kobe; Tomoharu Miyamoto, Itami, both of Japan

[73] Assignee: Sumitono Bakelite Company Limited, Tokyo, Japan

[*] Notice: The portion of the term of this patent subsequent to Mar. 4, 2009 has been disclaimed.

[21] Appl. No.: 768,302

[22] PCT Filed: Feb. 5, 1991

[86] PCT No.: PCT/JP91/00133

§ 371 Date: Mar. 4, 1992

§ 102(e) Date: Mar. 4, 1992

[87] PCT Pub. No.: WO91/12187

PCT Pub. Date: Aug. 22, 1991

[30] Foreign Application Priority Data

Feb. 6, 1990 [JP] Japan ................ 2-10225[U]

[51] Int. Cl.$^5$ ............................ B32B 5/16; B32B 7/12
[52] U.S. Cl. .......................... 428/354; 428/323; 428/328; 428/344; 428/349; 428/355
[58] Field of Search ............... 428/344, 356, 354, 40, 428/323, 328, 349, 355

[56] References Cited

U.S. PATENT DOCUMENTS

| | | | |
|---|---|---|---|
| 4,367,312 | 1/1983 | Bontinck et al. | 525/93 |
| 4,548,862 | 10/1985 | Hartman | 428/356 |
| 4,735,847 | 4/1988 | Fujiwara et al. | 528/356 |
| 4,963,405 | 10/1990 | Yamashita et al. | 428/40 |
| 5,091,251 | 2/1992 | Sakumoto et al. | 428/344 |
| 5,208,103 | 5/1993 | Miyamoto et al. | 428/354 |

FOREIGN PATENT DOCUMENTS

| | | |
|---|---|---|
| 0150882 | 8/1985 | European Pat. Off. |
| 57-48639 | 3/1982 | Japan |
| 60-113998 | 6/1985 | Japan |
| 60-182200 | 9/1985 | Japan |
| 61-188957 | 11/1986 | Japan |
| 61-202362 | 12/1986 | Japan |
| 62-108277 | 7/1987 | Japan |
| 1-112599 | 7/1989 | Japan |
| 2-04670 | 1/1990 | Japan |

*Primary Examiner*—George F. Lesmes
*Assistant Examiner*—Blaine Copenheaver
*Attorney, Agent, or Firm*—Browdy and Neimark

[57] ABSTRACT

A cover tape used for packaging of chip type electronic parts, which is heat-sealable to a plastic carrier tape having at given intervals pockets for accommodation of chip type electronic parts, characterized in that the outer layer is a biaxially oriented film consisting of polyester, polypropylene or nylon and the adhesion layer consists of a dispersion of conductive fine powders in a thermoplastic resin, said conductive fine powders consisting of tin oxide, zinc oxide, titanium oxide, carbon black or a Si-based organic compound, or their combination, said thermoplastic resin consisting of polyurethane resin, acrylic resin, polyvinyl chloride resin, ethylene-vinyl acetate resin or polyester resin, or their combination.

6 Claims, 1 Drawing Sheet

5,346,765

COVER TAPE FOR PACKAGING CHIP TYPE ELECTRONIC PARTS

TECHNICAL FIELD

The present invention relates to a cover tape heat-sealable to a plastic carrier tape having at given intervals pockets for accomodation of chip type electronic parts, which cover tape constitutes one component of packaging materials which are used for storage, transportation and mounting of chip type electronic parts and which are capable of arranging and taking out said electronic parts to protect them from contamination and to mount them on an electronic circuit substrate.

BACKGROUND ART

In recent years, chip type electronic parts used for surface mounting, such as ICs, transistors, diodes, condensers, piezoelectric resistors and the like have been supplied by being contained in packaging materials consisting of a plastic carrier tape having at given intervals pockets formed by embossing so as to accomodate chip type electronic parts of particular shape and a cover tape heat-sealable to the carrier tape. The electronic parts contained in the packaging materials are automatically taken out after peeling the cover tape of the package, and are mounted on the surface of an electronic circuit substrate.

The strength when the cover tape is peeled off from the carrier tape is called "peel-off strength". When the peel-off strength was too low, there was a problem that the cover tape was separated from the package at the time of the package transfer and the contents, i.e., the electronic parts fell off. When the peel-off strength was too high, there occurred a phenomenon that the carrier tape underwent vibration in peeling the cover tape and, as a result, the electronic parts jumped out of the pockets right before their mounting, i.e., jumping trouble.

As a material for the carrier tape, there have conventionally been used polyvinyl chloride (PVC) sheet, polystyrol sheet, polyester (PET) sheet, polycarbonate sheet and acrylic sheet, all of easy sheeting. Meanwhile, as a cover tape heat-sealable to the carrier tape, there have generally been used a composite film obtained by laminating a heat-sealable polyethylene-modified film or a heat-sealable ethylene-vinyl acetate copolymer (EVA)-modified film to a biaxially oriented polyester film, a PVC sheet or a styrol type sheet. In the conventional cover tape, however, the peel-off strength was greatly affected by the sealing conditions such as sealing temperature, sealing pressure and the like, and the fluctuation in sealing conditions made it difficult to control the peel-off strength in an appropriate range as mentioned above; further, the peel-off strength was also affected by the temperature and humidity during the storage of the conventional cover tape or during the storage after sealing, whereby the peel-off strength was increased or decreased with the lapse of time and, in some cases, deviated from an appropriate range.

With the significant improvement in surface mounting technique in recent years, electronic parts to be surface-mounted have come to be made in chips of higher capability and smaller size. In such a movement, the electronic parts, when transferred in a package, have undergone vibration and contact with the embossed inner surface of the carrier tape of the package or the inner surface of the cover tape of the package, and the resulting friction generated static electricity; static electricity has been also generated when the cover tape was peeled off from the carrier tape; this static electricity has generated sparks to cause destruction and deterioration of the electronic parts. Thus, the electronic parts have had troubles due to static electricity, and it has been a most important task to develop an antistatic measure for packaging materials such as carrier tape and cover tape.

The antistatic treatment for a carrier tape has hitherto been effected by incorporation or coating of carbon black into or on the cover tape material used, and the effect has been satisfactory. However, no sufficient measure has yet been taken for the antistatic treatment for a cover tape, and currently there is merely effected, for example, coating of an antistatic agent or a conductive material on the outer layer of the cover tape. This treatment, however, has not been sufficient for the protection of electronic parts to be contained by sealing, because the treatment is applied to the outer side of the cover tape, and particularly the treatment was ineffective for the static electricity generated by the contact of the inner surface of the cover tape with the electronic parts. The antistatic treatment for the inner surface of the cover tape, i.e. the adhesion layer of the cover tape can be effected by coating or incorporation of an antistatic agent on or into the adhesion layer. In this approach, however, the antistatic agent incorporated into the adhesion layer has bled onto the inner surface of the cover tape and invited unstable sealing and many troubles due to poor sealing; moreover, the antistatic effect has decreased with the lapse of time, has been greatly affected by the conditions under which the package was used, i.e., temperature and humidity, particularly humidity, and has significantly decreased under a low humidity such as 10% R.H. (relative humidity); thus, no sufficient effect has been obtained. Meanwhile, the incorporation of a conductive material into the adhesion layer has been technically difficult, because the adhesion layer has been formed by laminating a film or the like to an outer layer; moreover, the incorporation has significantly reduced the transparency of the resulting cover tape, making the cover tape usability questionable. The coating of a conductive material on adhesion layer has not been effected, because the selection of a binder stably bondable to the carrier tape has been difficult, and because the adhesion layer is covered and hidden by the coating.

DISCLOSURE OF THE INVENTION

The present inventors carried out extensive study in order to solve the above-mentioned problems and obtain a cover tape whose adhesion layer has been subjected to an antistatic treatment, whose peel-off strength is only slightly affected by the sealing conditions and shows small change with the lapse of time, and whose sealing property is stable. As a result, the present inventors found that a composite film comprising an outer layer consisting of a biaxially oriented film and an adhesion layer coated on the outer layer, the adhesion layer being a dispersion of conductive fine powders in a heat-sealable thermoplastic adhesive, or a composite film comprising, between the outer layer and the adhesion layer, an intermediate layer consisting of an olefin layer, is transparent and can be used as a cover tape having good properties. The above finding has led to the completion of the present invention.

The present invention resides in a cover tape used for packaging of chip type electronic parts, which is heat-sealable to a plastic carrier tape having at given intervals pockets for accommodation of chip type electronic parts, characterized in that the outer layer is a biaxially oriented film consisting of polyester, polypropylene or nylon and the adhesion layer consists of a dispersion of conductive fine powders in a thermoplastic resin consisting of polyurethane resin, acrylic resin, polyvinyl chloride resin, ethylene-vinylacetate copolymer resin, or polyester resin, or a combination thereof, said conductive fine powders consisting of tin oxide, zinc oxide, titanium oxide, carbon black or a Si-based organic compound; or a cover tape used for packaging of chip type electronic parts, comprising, between the above outer layer and the adhesion layer, an intermediate layer which is a polyolefin layer consisting of polyethylene, ethylene-vinyl acetate copolymer, an ionomer, polypropylene or their modification product. The preferred embodiment of the present invention is a cover tape for packaging of chip type electronic parts, characterized in that the amount of the conductive fine powders added is 10-100 parts by weight per 100 parts by weight of the thermoplastic resin of the adhesion layer, that the adhesion strength between the adhesion layer of the cover tape and the sealing surface of the carrier tape is larger than the interlaminar adhesion strength between the outer or intermediate layer and adhesion layer of the cover tape, that the interlaminar adhesion strength between the outer or intermediate layer and adhesion layer of the cover tape is 10–120 g per 1 mm of sealing width, and that the visible light transmittance of the cover tape is 10% or more.

Figure 1:
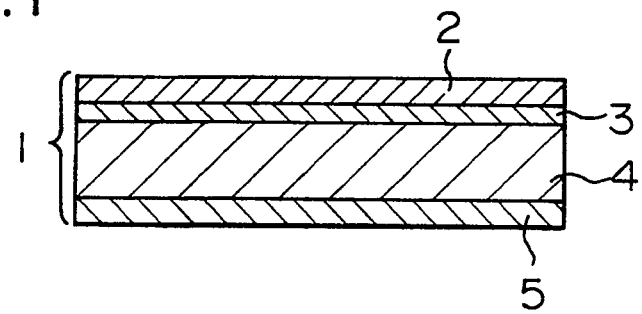
FIG. 1 is a sectional view showing an example of the layer constitution of a cover tape of the present invention.

In the drawings, the numerals 1 to 7 and 7' have the following meanings.

1: Cover tape, 2: Biaxially oriented film,
3: Adhesive layer, 4: Intermediate layer
5: Adhesion layer, 6: Carrier tape
7: Heat-sealed portion of adhesion layer
7': The same as above

DETAILED EXPLANATION OF THE INVENTION

The constitutional elements of the cover tape 1 of the present invention are explained with reference to FIG. 1. The outer layer 2 is a biaxially oriented film consisting of biaxially oriented polyester film, biaxially oriented polypropylene film or biaxially oriented nylon film, and has a thickness of 6–100 $\mu$, transparency and high rigidity. When the thickness is less than 6 $\mu$m, the rigidity is lost. When the thickness exceeds 100 $\mu$, the hardness is too high, making the sealing unstable. The side of the outer layer 2 contacting with the adhesive layer 3 can be, if necessary, subjected to a surface treatment such as corona treatment, plasma treatment, sandblasting treatment or the like to increase the adhesion strength to the adhesive layer 3. The adhesion layer 5 Consists of a transparent thermoplastic resin of heat-sealing lacquer type (e.g. polyurethane resin, acrylic resin, ethylene-vinyl acetate copolymer resin, polyvinyl chloride resin, polyester resin), and there is selected one single resin or a mixed resin each of which is heat-sealable to a plastic carrier tape 6 to which the adhesion layer 5 is to be bonded.

In the adhesion layer there are uniformly dispersed conductive fine powders consisting of tin oxide, zinc oxide, titanium oxide, carbon black or a Si-based organic compound. The surface resistance of the adhesion layer after film formation is required to be $10^{13}$ ohms per square or less and is preferably in a range of $10^6$–$10^9$ ohm per square When the surface resistance is larger than $10^{13}$ ohm per square the antistatic effect is extremely poor and no desired property can be obtained. The amount of the conductive fine powders added is 10–100 parts by weight, preferably 30–70 parts by weight per 100 parts by weight of the thermoplastic resin of the adhesion layer, in view of the above surface resistance requirement. When the amount is less than 10 parts by weight, no antistatic effect is exhibited; when the amount is more than 100 parts by weight, the dispersibility of the conductive fine powders in the thermoplastic resin of the adhesion layer is remarkably poor and such an amount is not suitable for production. The antistatic material has conductivity by itself and accordingly has antistatic effect semi-permanently, and does not cause bleeding, etc. and therefore does not adversely affect the sealing property of the adhesion layer; the surface resistance of the adhesion layer is controlled at a level of $10^{13}$ ohms per square or less and hence, in the package comprising the carrier tape 6 containing electronic parts and the cover tape 1 sealed to the cover tape 6, no static electricity is generated by the contact of the electronic parts with the cover tape 1 during the transportation of the package, or at the time of peeling of the cover tape 1 for pick-up of the electronic parts, whereby the electronic parts can be prevented from troubles due to static electricity.

In order to enhance the antistatic effect, an antistatic layer or a conductive layer may be provided on both sides of the outer layer 2, i.e., the biaxially oriented film. The method for forming a heat-sealable adhesion layer can be a film formation method using a melt or a film formation method using a solution, but the film formation method using a solution is preferable in view of the dispersibility of the conductive fine powders. The film thickness of the adhesion layer is preferably 5 $\mu$m or less, more preferably 2 $\mu$m or less. When the film thickness is larger than 5 $\mu$m, it is difficult to form an adhesion layer by the method using a solution, in view of the procedure adopted by the method.

When there is formed, between the outer layer 2 and the adhesion layer 5, an intermediate layer which is a polyolefin layer consisting of polyethylene, ethylene-vinyl acetate copolymer, ionomer, polypropylene or their modification product, the intermediate layer further improves the sealing property of the cover tape, because it acts as a cushion layer so as to enable the uniform application of heat and pressure during heat sealing and moreover improves the tear resistance of the cover tape. In this case, the thickness of the polyolefin layer is 10 μm or more, preferably 20-60 μm. When the thickness is smaller than 10 μ, no cushion effect is obtained; when the thickness is larger than 60 μm, the heat sealing property is rather deteriorated. In order to improve the lamination strength between the outer layer and the intermediate layer, it is possible to laminate these two layers via an adhesive layer 3 of lacquer type, said layer 3 being formed by drying, solidifying and curing an isocyanate type, an imine type or the like.

Figure 2:
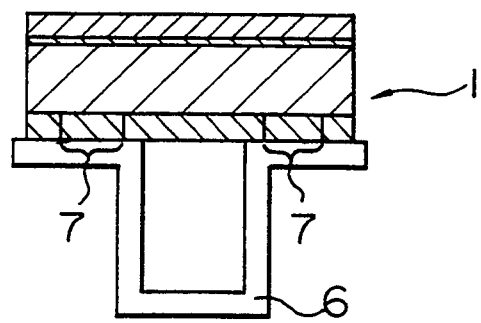
FIG. 2 is a sectional view showing a state where a cover tape of the present invention has been bonded to a carrier tape.
Figure 3:
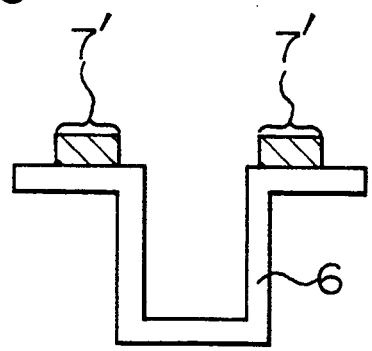
FIG. 3 is a sectional view showing a state of a carrier tape where a cover tape of the present invention has been bonded to the carrier tape and then peeled therefrom.
Figure 4:
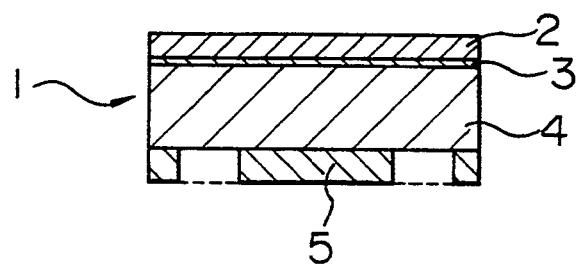
FIG. 4 is a sectional view showing a state of a cover tape of the present invention where the cover tape has been bonded to a carrier tape and then peeled therefrom.

In the seal-peel process of the cover tape, first the cover tape 1 is continuously sealed to the both sides of the carrier tape 6 in a two-rail shape with the 1 one side sealing width of about 1 mm (FIG. 2); then, the cover tape 1 is peeled off from the carrier tape 6. In this peeling, when the adhesion strength between the adhesion layer 5 of the cover tape 1 and the sealing surface of the carrier tape 6 is smaller than the interlaminar adhesion strength between the outer layer 2 and adhesion layer 5 of the cover tape 1 (in the case of the cover tape using no intermediate layer), the peel-off strength corresponds to the adhesion strength between the adhesion layer 5 of the cover tape 1 and the sealing surface of the carrier tape 6, and peeling occurs in a form of interfacial peeling which is the most common peeling mechanism currently adopted. In this case, strong sealing of the cover tape to the carrier tape makes peeling difficult, and weak sealing incurs spontaneous peeling; thus, it has been unable to satisfy both of two contradictory properties essentially required for the cover tape, i.e., high sealability to the carrier tape and easy peelability at the time of peeling. Meanwhile, when, as in the present invention, the adhesion strength between the adhesion layer 5 of the cover tape 1 and the sealing surface of the carrier tape 6 is larger than the interlaminar adhesion strength between the outer layer 2 and adhesion layer 5 of the cover tape 1 (in the case of the cover tape using no intermediate layer), only the sealed portion of the adhesion layer 5 remains on the carrier tape (FIG. 3) and, in the cover tape after peeling (FIG. 4), only the heat-sealed portion of the adhesion layer 5 is lost; thus peeling occurs in a form of the so-called transfer peeling. That is, the peel-off strength corresponds to the interlaminar adhesion strength between the adhesion layer 5 and the outer layer 2; and it is possible to design so that the sealing/peeling surface can be completely separated, the sealing of the cover tape 1 to the carrier tape 6 can be effected strongly, and the peeling of the cover tape 1 can be effected very easily. In short, the peeling surfaces are designed in the cover tape 1, and the interlaminar adhesion strength can be designed freely irrelevantly to the material of the carrier tape 6. The sealing surface of the cover tape can be strongly sealed to the carrier tape 6 by the selection of an adhesive, whereby a stable seal-peel mechanism can be obtained.

In this case, an adhesive is selected so that the interlaminar adhesion strength between the outer layer 2 and adhesion layer 5 of the cover tape 1 becomes 10-120 g, preferably 10-70 g per 1 mm of sealing width. When the peeling strength is smaller than 10 g, there occurs a problem during the transportation of the package that the cover tape is spontaneously removed and the electronic parts contained in the package fall off. When the peeling strength is larger than 120 g, there occurs a phenomenon that the carrier tape undergoes vibration at the time of cover tape peeling and the electronic parts jump out of the pockets of the carrier tape right before the mounting of the electronic parts, i.e., jumping trouble. According to the transfer peeling mechanism of the present invention, as compared with the conventional interfacial peeling, there can be obtained a cover tape having intended property, i.e., peel-off strength which is only slightly affected by sealing conditions and which shows small change with the lapse of time when stored under various conditions.

The present cover tape is constituted so as to have a visible light transmittance of 10% or more, preferably 50% or more, making it possible to identify the electronic parts contained in the carrier tape by sealing, visually or using an instrument. When the transmittance is lower than 10%, the identification of the electronic parts is difficult.

According to the present invention, owing to the following three features, i.e., a feature that the adhesion layer has been subjected to an antistatic treatment, and hence generation of static electricity by the contact of the electronic parts with the cover tape or at the time of cover tape peeling is reduced, and the antistatic effect is stable against the use conditions or the lapse of time and has no influence on the sealing property of the cover tape, a feature that the peel-off strength can be set at a desired level in a range of 10-120 g per mm by the combination of the adhesion layer and the outer layer or of the intermediate layer and the adhesion layer, and a feature that the peel-off strength is determined by the interlaminar adhesion strength within the cover tape and accordingly is not affected by the sealing conditions between the adhesion layer and the carrier tape, it is possible to solve the conventional problems of a cover tape, i.e., a problem that the peel-off strength is greatly affected by the sealing conditions, a problem that the peel-off strength changes with the lapse of time depending upon the storage conditions, and a problem that static electricity is generated by the contact of the electronic parts with the cover tape or at the time of cover tape peeling, and thereby it is possible to obtain a stable peel-off strength.

BEST MODE FOR CARRYING OUT THE INVENTION

Examples of the present invention and Comparative Examples are shown hereinafter. However, the present invention is in no way restricted by these Examples.

Examples 1, 2, 3, 4 and 5 and Comparative Examples 1, 2, 3 and 4

On a biaxially oriented film or on a polyolefin film side of a laminate of a biaxially oriented film and the polyolefin film there was prepared an adhesion layer in a film thickness of 2 μm using a gravure coater according to solution method, to obtain various cover tapes composed of layers as shown in Table 1. Each of the cover tapes was slitted to a width of 5.5 mm and then heat-sealed to a PVC carrier tape of 8 mm in width, after which measurement of peeling strength was effected. There were also effected measurements of surface resistance at the adhesion layer side and visible light transmittance of each of the experimental cover tapes. The evaluation results of these properties are shown in Table 2.

TABLE 1

| | Outer layer | Intermediate layer | Adhesion layer | Conductive fine powders (amount added) |
|---|---|---|---|---|
| Example 1 | Biaxially oriented PET | PE | PVC | $SnO_2$ (50) |
| Example 2 | Biaxially oriented PP | EVA | EVA | $TiO_2$ (30) |
| Example 3 | Biaxially oriented PET | — | PET | $ZnO_2$ (70) |
| Example 4 | Biaxially oriented NY | Ionomer | Polyurethane | Carbon black (70) |
| Example 5 | Biaxially oriented PP | PP | Acrylic | Ethyl silicate (50) |
| Comparative Example 1 | Biaxially oriented PET | — | EVA | — |
| Comparative Example 2 | Biaxially oriented PET | — | St | Surfactant (1) |
| Comparative Example 3 | Biaxially oriented PET | — | EVA | $SnO_2$ (120) |
| Comparative Example 4 | Biaxially oriented PP | EVA | PVC | $ZnO_2$ (5) |

Notes:
PET: Polyethylene terephthalate, PP: Polypropylene, NY: Nylon, PE: Polyethylene, EVA: Ethylene-vinyl acetate copolymer, PVC: Polyvinyl chloride, St: Polystyrene, $SnO_2$: Tin oxide, $TiO_2$: Titanium oxide, $ZnO_2$: Zinc Oxide
Layer thicknesses: Outer layer = 12μ, intermediate layer = 30μ, adhesion layer = 2μ
Amount of conductive fine powders: Amount (parts by weight) added per 100 parts by weight of thermoplastic resin of adhesion layer

TABLE 2

| | Peeling strength g/mm | | | Mechanism of peeling | Surface resistance of adhesion layer ohms per square | Total light transmittance % |
|---|---|---|---|---|---|---|
| | Initial value | 40° C.-90% 30 days | 60° C. 30 days | | | |
| Example 1 | 50 | 51 | 55 | Transfer peeling | $10^7$ | 88.0 |
| Example 2 | 92 | 105 | 121 | Transfer peeling | $10^9$ | 75.2 |
| Example 3 | 35 | 15 | 80 | Transfer peeling | $10^6$ | 45.3 |
| Example 4 | 24 | 12 | 113 | Transfer peeling | $10^{12}$ | 20.5 |
| Example 5 | 70 | 24 | 100 | Transfer peeling | $10^{13}$ | 68.9 |
| Comparative Example 1 | 82 | 25 | 180 | Interfacial peeling | $10^{15}$ | 82.3 |
| Comparative Example 2 | 38 | 5 | 145 | Interfacial peeling | $10^{14}$ | 78.3 |
| Comparative Example 3 | 74 | 0 | 197 | Transfer peeling Cohesion peeling | $10^6$ | 7.8 |
| Comparative Example 4 | 80 | 15 | 187 | Interfacial peeling | $10^{14}$ | 85.5 |

Notes:
Cohesion peeling: Destruction of adhesive material
Heat-sealing conditions: 140° C., 1 kg/cm², 1 sec, Sealing width = 1 mm × 2
Peeling conditions: 180° peeling, Peeling speed = 300 mm/min
Number of samples: 3

INDUSTRIAL APPLICABILITY

The cover tape used for packaging of chip type electronic parts according to the present invention is very useful as a cover tape heat-sealable to a plastic carrier tape having at given intervals pockets for accomodation of chip type electronic parts, which cover tape constitutes one component of packaging materials which are used for storage, transportation and mounting of chip type electronic parts and which are capable of arranging and taking out said electronic parts to protect them from contamination and to mount them on an electronic circuit substrate.

We claim:

1. A cover tape for packaging of chip type electronic parts which is heat-sealable to a plastic carrier tape having at given intervals pockets for accommodation of chip type electronic parts, said cover tape comprising an outer layer and an adhesion layer;

said outer layer is a biaxially oriented film selected from the group consisting of polyester, polypropylene, and nylon, said outer layer having a thickness of from 6 to 100 μm;

said adhesion layer consisting of a dispersion of conductive fine powders in a thermoplastic resin, said conductive fine powders selected from the group consisting of tin oxides zinc oxide, titanium oxide, silicon-based organic compounds, and combinations thereof, said adhesion layer having a thickness of 5 μm or less;

wherein the amount of conductive fine powders is 10–100 parts by weight per 100 parts by weight of the thermoplastic resin of the adhesion layer, and the surface resistance of the adhesion layer is $10^{13}$ ohms per square or less;

the interlaminar adhesion strength between the outer layer and the adhesion layer is 10/120 g/mm of sealing width; and the visible light transmittance of the cover tape is 10% or more.

2. The cover tape according to claim 1 wherein the thermoplastic resin is selected from the group consisting of polyurethane resin, acrylic resin, polyvinyl chloride resin, ethylene-vinyl acetate copolymer resin, polyester resin, and combinations thereof.

3. The cover tape according to claim 1 wherein the adhesion strength between the adhesion layer of the cover tape and the sealing surface of the carrier tape is greater than the interlaminar adhesion strength between the outer layer and the adhesion layer.

4. A cover tape for packaging of chip type electronic parts which is heat-sealable to a plastic carrier tape having at given intervals pockets for accommodation of chip type electronic parts comprising an outer layer, an intermediate layer and an inner layer;

said outer layer is a biaxially oriented film consisting of polyester, polypropylene or nylon, said outer layer having a thickness of from 6 to 100 $\mu$m;

said intermediate layer consists of a polyolefin selected from the group consisting of polyethylene, ethylenevinyl acetate copolymer, ionomer, and polypropylene, said intermediate layer having a thickness of 10 $\mu$m or more;

said adhesion layer consists of a dispersion of conductive fine powders in a thermoplastic resin, said conductive fine powders selected from the group consisting of tin oxide, zinc oxide, titanium oxide, a silicon-based organic compound, and combinations thereof said adhesion layer having a thickness of 5 $\mu$m or less;

wherein the amount of the conductive fine powders is from 10–100 parts by weight per 100 parts by weight of the thermoplastic resin of the adhesion layer and the surface resistance of the adhesion layer is $10^{13}$ ohms per square or less;

the interlaminar adhesion strength between the intermediate layer and the adhesion layer is 10–120 g/mm of sealing width;

the visible light transmittance of the cover tape is 10% or more.

5. A cover tape according to claim 4 wherein the thermoplastic resin of the adhesion layer is selected from the group consisting of polyurethane resin, acrylic resin, polyvinyl chloride resin, ethylene-vinyl acetate copolymer resin, polyester resin, and combinations thereof.

6. A cover tape according to claim 4 wherein the adhesion strength between the adhesion layer of the cover tape and the sealing surface of the carrier tape is greater than the interlaminar adhesion strength between the intermediate layer and the adhesion layer of the cover tape.

* * * * *